US007755421B2

(12) United States Patent
Chen et al.

(10) Patent No.: US 7,755,421 B2
(45) Date of Patent: Jul. 13, 2010

(54) ANALOG AMPLIFIER HAVING DC OFFSET CANCELLATION CIRCUIT AND METHOD OF OFFSET CANCELLATION FOR ANALOG AMPLIFIERS

(75) Inventors: Jinghong Chen, Basking Ridge, NJ (US); Gregory W. Sheets, Breinigsville, PA (US); Joseph Anidjar, Asbury, NJ (US); Robert J. Kapuschinsky, Hazleton, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/437,860

(22) Filed: May 8, 2009

(65) Prior Publication Data

US 2009/0212856 A1    Aug. 27, 2009

Related U.S. Application Data

(63) Continuation of application No. 11/420,177, filed on May 24, 2006, now Pat. No. 7,532,065.

(60) Provisional application No. 60/698,375, filed on Jul. 12, 2005.

(51) Int. Cl.
H03F 1/02 (2006.01)

(52) U.S. Cl. ......................................................... 330/9

(58) Field of Classification Search ................... 330/9, 330/124 R, 307
See application file for complete search history.

(56) References Cited

U.S. PATENT DOCUMENTS

| 5,295,161 | A  | 3/1994  | Dreps et al. ............... 375/318 |
| 5,432,475 | A  | 7/1995  | Fukahori .................... 330/254 |
| 5,798,664 | A  | 8/1998  | Nagahori et al. ........... 327/307 |
| 6,433,612 | B1 | 8/2002  | Jenkins ...................... 327/408 |
| 6,489,811 | B2 | 12/2002 | Jenkins ...................... 326/115 |
| 6,674,328 | B2 | 1/2004  | Uto et al. ................... 330/259 |
| 6,686,787 | B2 | 2/2004  | Ling .......................... 327/203 |
| 6,710,645 | B2 | 3/2004  | Isken et al. .................... 330/9 |
| 6,777,988 | B2 | 8/2004  | Tung et al. ................. 327/115 |
| 6,825,707 | B2 | 11/2004 | Viehmann et al. ........... 327/407 |

(Continued)

FOREIGN PATENT DOCUMENTS

JP           07240640           9/1995

OTHER PUBLICATIONS

"Device Mismatch and Tradeoffs in the Design of Analog Circuits," by Peter R. Kinget, IEEE Journal of Solid-State Circuits, vol. 40, No. 6, Jun. 2005, pp. 1211-1224.

"Broadband Circuits for Optical Fiber Communication," by Eduard Sackinger, E-book published May 2005, Publisher: John Wiley & Sons, 2 page excerpt.

(Continued)

*Primary Examiner*—Robert Pascal
*Assistant Examiner*—Khiem D Nguyen
(74) *Attorney, Agent, or Firm*—Mendelsohn, Drucker & Associates, P.C.; Craig M. Brown; Steve Mendelsohn

(57) ABSTRACT

An amplifier having DC offset compensation includes at least one input node and a pair of differential output nodes, a biasing circuit coupled to the input node; and a plurality of current sources. Selected ones of said current sources are coupled to the input node to adjust a DC voltage at the input node to provide DC offset compensation for the amplifier

16 Claims, 3 Drawing Sheets

U.S. PATENT DOCUMENTS

| | | | |
|---|---|---|---|
| 6,897,700 B1 | 5/2005 | Fu et al. | 327/307 |
| 6,903,593 B2 | 6/2005 | Wang | 327/307 |
| 6,937,083 B2 | 8/2005 | Manlove et al. | 327/307 |
| 6,968,172 B2 | 11/2005 | Saito | 455/306 |
| 7,154,294 B2 | 12/2006 | Liu et al. | 326/27 |
| 7,259,616 B2 | 8/2007 | Chang | 330/9 |
| 7,271,649 B2 | 9/2007 | Chiu et al. | 330/9 |
| 7,388,406 B2 | 6/2008 | Chen | 326/115 |
| 2003/0141912 A1 | 7/2003 | Sudjian | 327/208 |
| 2004/0100307 A1 | 5/2004 | Wong et al. | 326/115 |
| 2004/0140831 A1 | 7/2004 | Wang | 327/115 |
| 2004/0227573 A1 | 11/2004 | Soda | 330/253 |
| 2004/0233183 A1 | 11/2004 | Saeki | 345/204 |
| 2006/0077003 A1 | 4/2006 | Chiu et al. | 330/9 |
| 2006/0186954 A1 | 8/2006 | Koller et al. | 330/9 |
| 2007/0018694 A1 | 1/2007 | Chen et al. | 326/115 |

OTHER PUBLICATIONS

"Electrical Backplane Equalization Using Programmable Analog Zeros and Folded Active Inductors," by Jinghong Chen et al., Agere Systems, Allentown, PA and Jenshan Lin, Dept. of Electrical Engineering, University of Florida, Gainesville, FL, 0-7803-9197-7/05, 2005 IEEE, pp. 1366-1369.

10

50

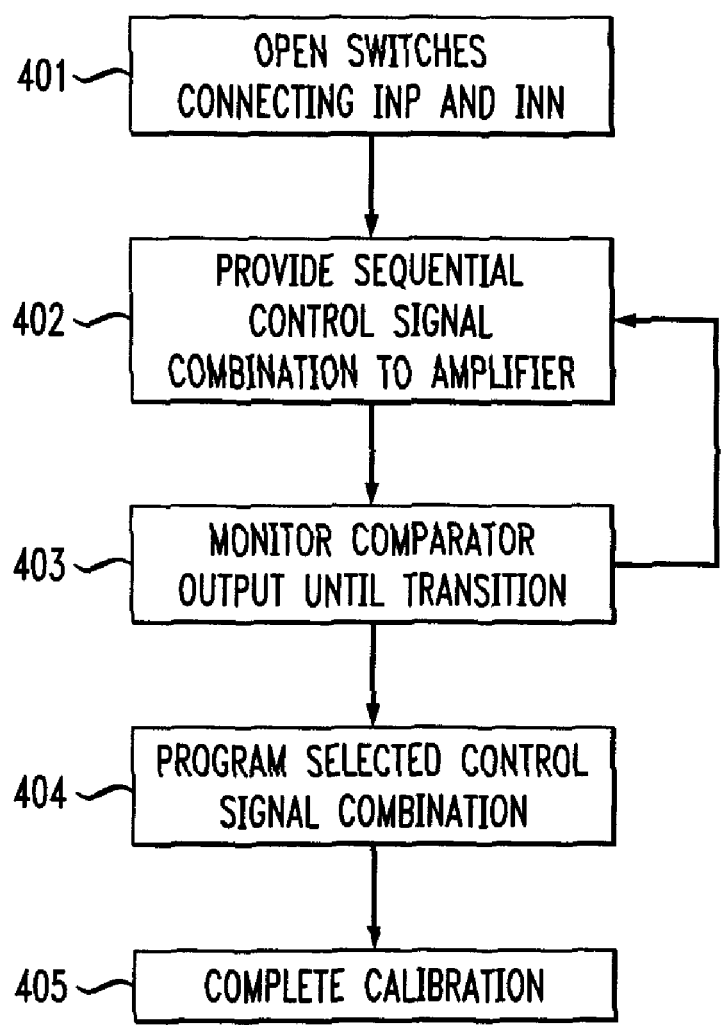

ABSTRACT/BODY

ANALOG AMPLIFIER HAVING DC OFFSET CANCELLATION CIRCUIT AND METHOD OF OFFSET CANCELLATION FOR ANALOG AMPLIFIERS

CROSS-REFERENCE TO RELATED APPLICATION

This application is a continuation of U.S. application Ser. No. 11/420,177, filed on May 24, 2006, which claims the benefit of the filing date of U.S. provisional patent application Ser. No. 60/698,375, filed on Jul. 12, 2005 and entitled "Electrical Backplane Equalization Using Programmable Analog Zeros And Folded Active Inductors", the teachings of all of which are incorporated herein by reference.

FIELD OF THE INVENTION

The present invention relates generally to analog amplifiers and more particularly to offset cancellation schemes for analog amplifiers.

BACKGROUND OF THE INVENTION

Differential amplifiers typically have a built-in or internal DC offset due to device mismatch and parameter variations caused by manufacturing variations, as will be understood by those in the art. This offset causes asymmetry or mismatching of the amplifier components. Of particular note, the DC offset produces mismatch in the common mode voltages of the differential outputs of the amplifier. The input-referred offset voltage of an amplifier is the differential voltage required to be applied at the input of the amplifier to produce a null output. Many applications require the cancellation/minimization of the offset voltage. For example, a limiting amplifier used in broadband optical communications often requires the offset voltage to be around 0.1 mV or less. When the offset voltage is higher, the decision circuit will slice the data at a non-optimal level which leads to a sensitivity reduction and thus a poor bit-error-rate performance. A typical single stage BJT amplifier has a 3σ random offset of a few millivolts. A RF MOS amplifier typically has an offset voltage of a few 10 millivolts. The offset is much larger for multiple stage amplifiers. Therefore, offset cancellation schemes are employed to reduce the inherent offset to the desired level.

FIG. 1 is a circuit diagram of a prior art analog amplifier circuit 10 having offset cancellation. The circuit 10 includes a main operational amplifier 12 having positive and negative inputs and positive and negative outputs. The differential input voltage signal ($V_{IP}$ and $V_{IN}$) at the inputs is AC coupled through a pair of capacitors to the main amplifier 12. A differential output signal ($V_{ON}$ and $V_{OP}$) is provided at the output nodes. The input capacitors are relatively large and are designed to remove the common mode DC component from the input data signal. The circuit 10 also includes an error operational amplifier 14 and two low-pass RC filters coupled between the outputs of the main amplifier 12 and the inputs of the error amplifier 14. The error amplifier 14 supplies a differential DC input voltage to the input of main amplifier 12 to compensate for the main amplifier's offset voltage. The error amplifier 14 senses the DC component from the main amplifier's output signal using the two low-pass RC filters and adjusts its output voltage until the main amplifier's differential output voltage is compensated. The output impedance of the error amplifier 14 together with the 50Ω output resistors serve as the input termination of the main amplifier 12.

There are two reasons why the circuit 10 does is not completely eliminate the offset voltage: (i) the finite gain of the error amplifier 14 and (ii) the offset voltage $V_{OS1}$ of the error amplifier. A simple analysis shows that the main amplifier 14 offset voltage is reduced to:

$$V'_{OS} = \frac{V_{OS} + A_1 V_{OS1}}{A \times A_1 + 1} \approx \frac{V_{OS}}{A \times A_1} + \frac{V_{OS1}}{A} \qquad (1)$$

Since the error amplifier 14 does not have to be fast, large transistors with good matching properties can be used to make $V_{OS1}$ very small. Depending on the amount of the offset that must be removed, the gain of the error amplifier 14 $A_1$ can be a buffer ($A_1=1$) or an amplifier ($A_1>1$). Typically, a buffer is sufficient for a BJT amplifier while MOS amplifiers require additional loop-gain to meet the offset cancellation.

The offset-compensation circuit of FIG. 1 does not only suppress the offset voltage, but also the low-frequency components of the input signal. This undesired effect leads to a low frequency cutoff in the main amplifier 12's frequency response. The 3-dB low-frequency cutoff due to the offset compensation is $$f_{LF} = \frac{1}{2\pi} \frac{A \times A_1/2 + 1}{R \times C} \qquad (2)$$

From this equation, it can be seen that in order to get a low cutoff frequency, we need to make the loop bandwidth $1/(2\pi \times RC)$ much smaller. For example, if $A \times A_1/2 = 100$, we need a loop bandwidth of 10 kHz to achieve a cutoff frequency of 1 MHz in the main amplifier 12. As a result, the resistance and capacitance used in the RC network are usually very large, occupying excessive and often unacceptable amounts of chip area.

SUMMARY OF THE INVENTION

An amplifier having DC offset compensation is provided. The amplifier includes at least one input node and a pair of differential output nodes, a biasing circuit coupled to the input node; and a plurality of current sources. Selected ones of the current sources are coupled to the input node to adjust a DC voltage at the input node to provide DC offset compensation for the amplifier.

A system and method for calibrating the amplifier are also provided.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIG. 4 is a flow diagram for an exemplary method of calibrating procedure.

DETAILED DESCRIPTION

Figure 2:
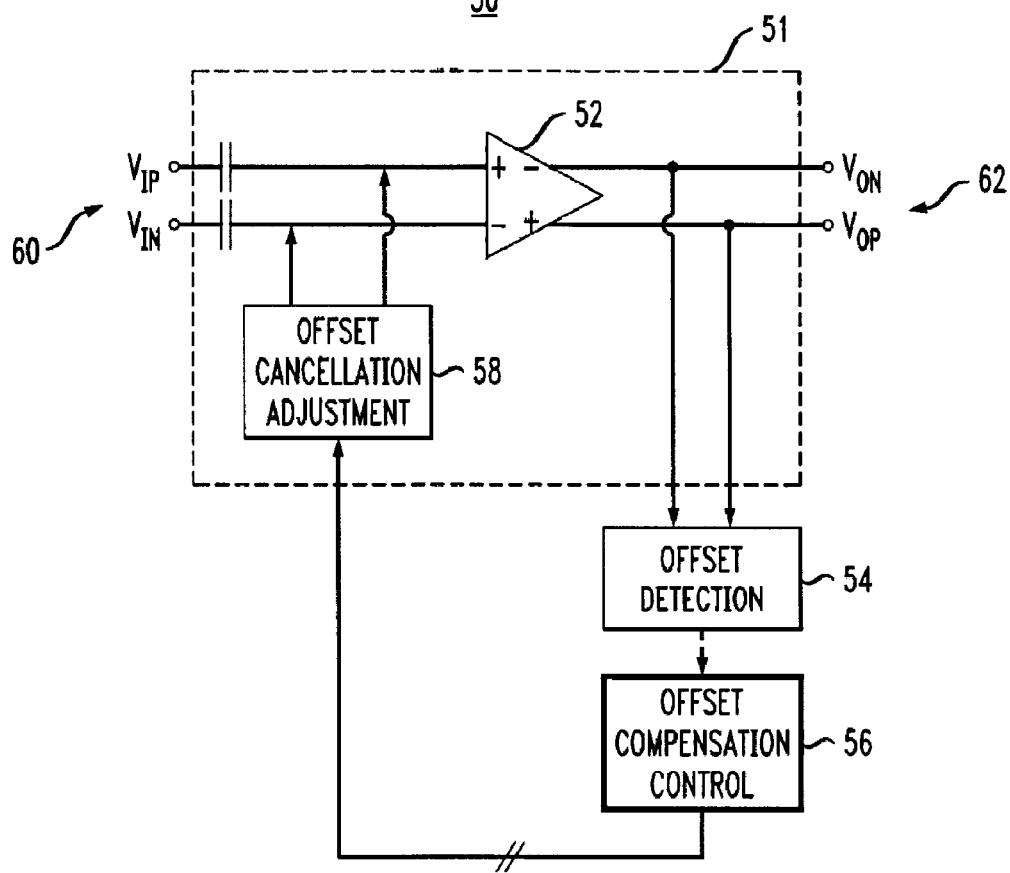
FIG. 2 is a block diagram of system for providing offset cancellation for an analog amplifier.

FIG. 2 is a block diagram of a system 50 for detecting and compensation for DC offset in an analog amplifier. The system includes an analog amplifier 51 having offset cancellation adjustment circuitry 58, an offset detection module 54 and an offset compensation control module 56. In one embodiment, the components shown within shadow box 51 are integrated on a single chip or substrate to form an amplifier, while offset detection module and offset compensation control modules 54, 56 are used for calibration of the amplifier 51 as described below in more detail. Though shown as separate components, offset detection module 54 and/or offset compensation control module 56 may be integrated into a chip or substrate with amplifier 51 to form a feedback loop in a self-calibrating amplifier. In one embodiment, only offset detection module 54 is integrated with amplifier device 51.

The amplifier device 51 of FIG. 2 includes inputs for receiving an input data signal 60. The input data signal 60 is amplified by an amplifier circuit, such as an operational amplifier 52, into an output data signal 62. In FIG. 2, input data signal 60 is a differential signal having a positive component $V_{IP}$ and a negative component $V_{IN}$, and output data signal 62 is a differential signal $V_{ON}$ and $V_{OP}$. The input signal may be AC coupled to amplifier 52 through a pair of blocking capacitors. Amplifier device 51 may be designed to accommodate a single-ended input data signal where one of the two differential inputs is left "floating" with no input.

Amplifier device 51 also includes an offset cancellation adjustment module 58. The offset cancellation adjustment module 58 is responsive to a control signal issued from offset compensation control module 56. Offset detection module 54 detects the inherent offset within the amplifier 52. For sake of brevity, FIG. 2 does not show additional amplifier stages within amplifier device 51, which may be employed in some embodiments. Such additional amplifier stages can be designed and implemented in accordance with conventional techniques.

Figure 2A:
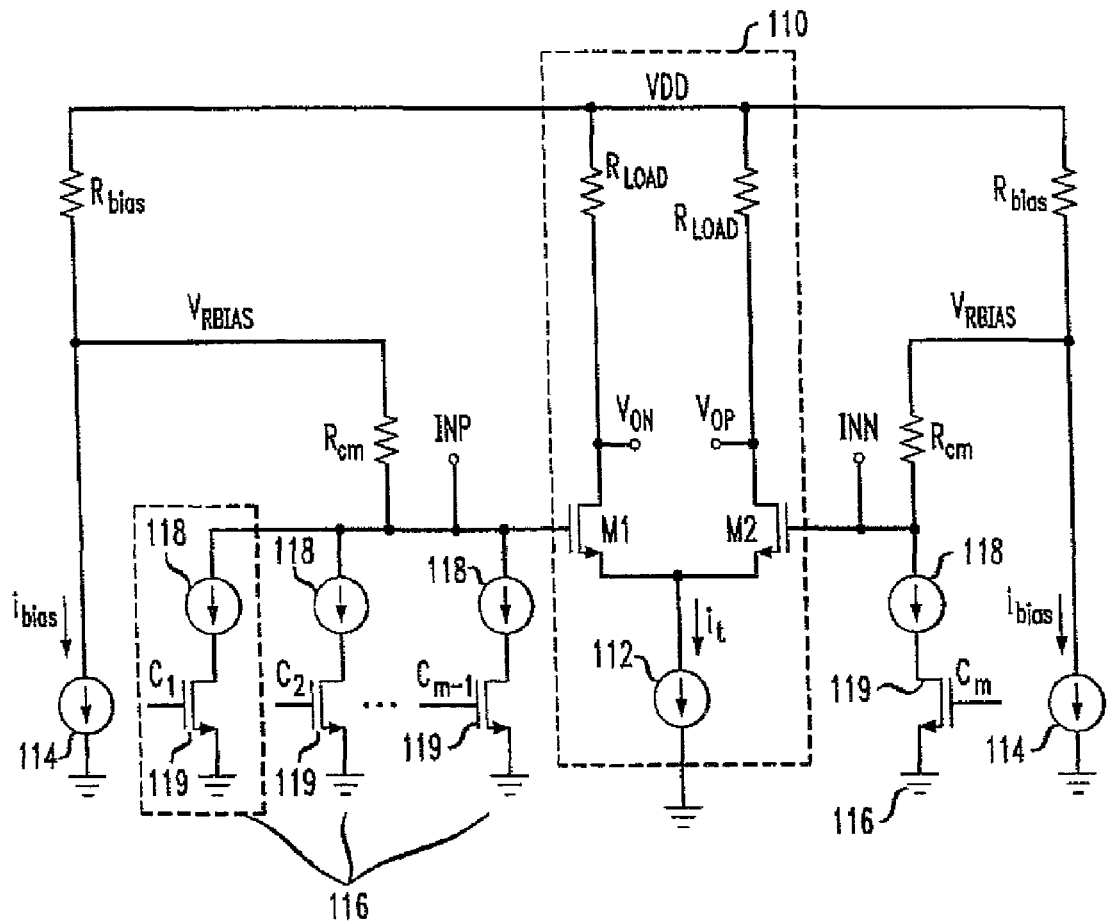
FIG. 2A is a circuit diagram of an analog amplifier with offset cancellation voltage adjustment circuitry according to an embodiment of the present invention.

FIG. 2A is a circuit diagram of an analog amplifier 100 having offset cancellation (also sometimes referred to as "offset compensation") adjustment circuitry according to an embodiment of the present invention. As used herein, "cancellation" does not require full removal of any DC offset but merely refers to compensation of the DC offset to within acceptable limits. In the illustrated embodiment, the amplifier 100 includes a MOS differential amplifier 110 having differential input nodes "INP" and "INN" for receiving input signals $V_{IP}$ and $V_{IN}$. Although an amplifier 110 is shown using MOSFET transistors, equivalent amplifier circuits may be configured for operation with other transistor types (e.g., BJT) and/or with other suitable active devices or switches.

The differential amplifier 110 includes a pair of load resistors ($R_{LOAD}$) coupled between power supply node VDD and differential output nodes $V_{ON}$ and $V_{OP}$. The amplifier 110 include differential input MOS transistors M1 and M2 coupled between the output nodes and a tail current source 112 for providing tail current $i_t$. Tail current source 112 typically includes a MOS transistor operating in saturation mode. Those skilled in the art are familiar with the operation of the differential amplifier 110, which is repeated herein. The tail current it and resistance value of $R_{LOAD}$ are selected to set the common mode voltage of the amplifier to a desired voltage level. In one embodiment, VDD is 1.0 volt, the load resistance is 100Ω and the common mode voltage is set to 0.8V.

Figure 1:
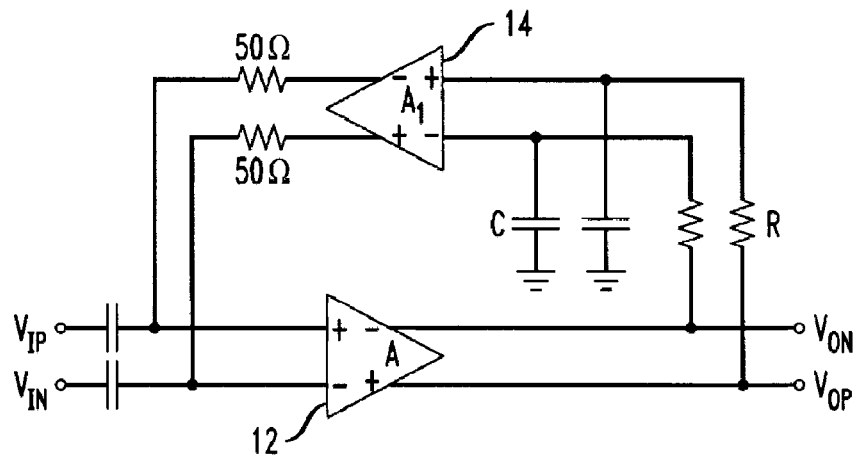
FIG. 1 is a circuit diagram of a prior art analog amplifier with offset cancellation.

The offset cancellation of FIG. 2A is performed by way of selectable adjustment circuitry rather than by the area consuming low pass filter/error amplifier circuitry discussed above in connection with FIG. 1. The adjustment circuitry includes bias resistors Rbias and current sources 114 for providing current $i_{bias}$ for setting the voltage at nodes $V_{RBIAS}$ to a default voltage level, i.e., to VDD−Rbias*$i_{bias}$. This default voltage level is the DC input to inputs INN and INP if no offset compensation is provided, as described below.

Voltage adjustment circuits 116 are coupled to differential input nodes INP and INN. In one embodiment, each adjustment circuit 116 includes a current source 118 coupled to the differential input node INN or INP and a switching transistor 119 coupled between the current source 118 and a ground node. In one embodiment, current sources 118 each comprise a MOS transistor. In the illustrated embodiment, "m" number of switching adjustment circuits 116 are provided responsive to control signals C1 to Cm as described below in more detail.

In one exemplary embodiment, the current from current sources 118 are binary weighted. Assume, by way of example, that m=4, i.e., that there are four switching adjustment circuits 116. In this embodiment, three adjustment circuits 116 are coupled to node INP and one adjustment circuit is coupled to node INN. The three current sources 118 coupled to node INP are designed to provide current drops across resistor $R_{CM}$ of 1 mV, 2 mV and 4 mV, thereby reducing the actual DC input voltage to input node INP from the default voltage $V_{RBIAS}$. The lone current source 118 coupled to node INN is designed to provide a current drop of 8 mV across resistor $R_{CM}$. Assuming these design parameters, different combinations of control signals C1, C2 and C3 provide different voltages at node INP as follows:

| C1 | C2 | C3 | Voltage at INP |
|----|----|----|----------------|
| 1 | 0 | 0 | $V_{RBIAS}$ - 1 mV |
| 0 | 1 | 0 | $V_{RBIAS}$ - 2 mV |
| 1 | 1 | 0 | $V_{RBIAS}$ - 3 mV |
| 0 | 0 | 1 | $V_{RBIAS}$ - 4 mV |
| 1 | 0 | 1 | $V_{RBIAS}$ - 5 mV |
| 0 | 1 | 1 | $V_{RBIAS}$ - 6 mV |
| 1 | 1 | 1 | $V_{RBIAS}$ - 7 mV |

Ideally, it is desired that the DC level of output $V_{ON}$ equals the DC output of $V_{OP}$, i.e., there is no offset, however, as explained above, there typically will be some offset due to process variations. In a first instance, assume that $V_{ON}$>$V_{OP}$ due to the offset voltage. In this situation, the input voltage at INP needs to be lowered to reduce the offset to an acceptable level, if not 0V. C1 is initially triggered to lower the voltage at INP by 1 mV. The offset is then checked and if 1 mV is not enough, then C1 can be turned off and C2 triggered to lower the voltage at INP by 2 mV. The offset is then checked again. Combinations of C1, C2 and C3 are tried until the offset is compensated.

On the other hand, assume the offset causes $V_{ON}$<$V_{OP}$, for example by 2 mV. Since $V_{ON}$<$V_{OP}$, C4 is turned on to lower INN by 8 mV. After C4 is triggered, INP will be 6 mV higher than the adjusted INN value. Signals C1, C2 and C3 are then selectively triggered as described above to lower INP by 6 mV until INP substantially equals INN, i.e., until any offset is within acceptable tolerances.

The following chart summarizes the voltage offset under various combinations.

| C1 | C2 | C3 | C4 | Voltage compensation |
|----|----|----|----|---------------------|
| 1 | 0 | 0 | 0 | −1 mV |
| 0 | 1 | 0 | 0 | −2 mV |
| 1 | 1 | 0 | 0 | −3 mV |
| 0 | 0 | 1 | 0 | −4 mV |
| 1 | 0 | 1 | 0 | −5 mV |
| 0 | 1 | 1 | 0 | −6 mV |
| 1 | 1 | 1 | 0 | −7 mV |
| 0 | 0 | 0 | 1 | +8 mV |
| 1 | 0 | 0 | 1 | +7 mV |
| 0 | 1 | 0 | 1 | +6 mV |
| 1 | 1 | 0 | 1 | +5 mV |
| 0 | 0 | 1 | 1 | +4 mV |
| 1 | 0 | 1 | 1 | +3 mV |
| 0 | 1 | 1 | 1 | +2 mV |
| 1 | 1 | 1 | 1 | +1 mV |

Other design approaches may be utilized for adjusting the voltages at INN and INP. For example, the current values need not be binary weighted. In this embodiment, the current value from the current source coupled to INN could be selected to provide a voltage at node INN of 8 mV and eight equally valued current sources for providing a 1 mv voltage drop could be coupled to INP. Current sources could then be incrementally triggered until the offset is compensated. Likewise, multiple selectable current sources may be provided coupled to both INP and INN, or a single current selectable current source could be coupled to INP and multiple selectable current sources coupled to node INN. Further, individual current sources could be coupled to either INN or INP by a pair of switches, so that the current source could be coupled to one, both or neither node as needed.

Nonetheless, the configuration shown in FIG. 2A is preferred as it provides size advantages. By binary weighting the current sources, multiple voltage combinations and relationships between INP and INN can be accomplished with a minimum number of current sources, and thus at reduced circuit complexity and chip area.

As should be understood, the increments in voltage drops across resistors $R_{CM}$ and the number of adjustment circuits can be readily selected to achieve a desired offset tolerance, within a given expected range of offsets. The embodiment described above, with m=4 and with the incremental voltage adjustments equal to 1 mV, can be used as long as the maximum expected offset is 8 mV and the maximum acceptable offset tolerance is 1 mV. If the maximum expected offset were 8 mV and the maximum acceptable offset tolerance were 0.5V, then m could be set to 5 and the incremental voltage adjustments set to 0.5 mV, for example. It should be apparent that the preferred binary weighted circuit design requires only one additional current source to implement these 16, as opposed to 8 (when m=4), offset compensation combinations.

For an amplifier designed in a deep submicron CMOS technology (for example a 90 nm CMOS technology), typical VDD is 1.0V. If Ibias=0.1 mA, then Rbias can be set at 2K to give a Vrbias=VDD−Ibias×Rbias=0.8V. If the maximum acceptable offset tolerance is 1 mV, then Rcm can be set at 10K, and the current source controlled by switch C1 can be set at 0.1 μA. Note that for the exemplary embodiment 0.1 μA×10K gives a maximum acceptable offset tolerance of 1 mV. The maximum acceptable offset tolerance of the amplifier is often determined by the particular applications. In optical applications where the received signal (e.g., the signal at the amplifier input nodes INN and INP) is small, a 0.1 mV or less maximum acceptable offset tolerance is often desired. On the other hand, in chip-to-chip communications where the received signal is large, a larger maximum acceptable offset tolerance (such as 1 mV) can be used.

An exemplary circuit is now described for providing control signals C1:Cm for triggering switches 119 for selectively connecting current sources 118 to nodes INN and INP, specifically for implementing offset compensation control and offset detection modules 56, 54.

Figure 3:
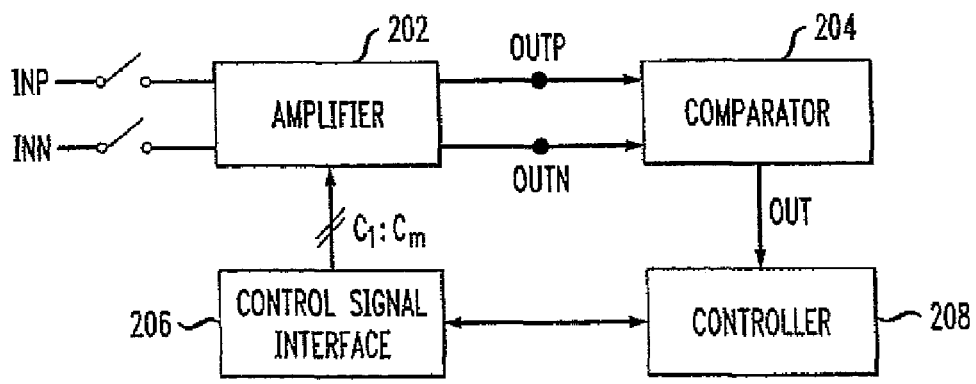
FIG. 3 is a block diagram of a system for determining offset cancellation in an analog amplifier.

As shown in the calibration system 200 of FIG. 3, the inputs to the amplifier 202 are disconnected by opening switches to isolate the amplifier 202 from external signal sources. The outputs (OUTP and OUTN) are coupled to a comparator 204. An offset compensation control signal interface 206 is coupled to the amplifier circuit to provide control signals C1:Cm. In one embodiment, the offset compensation control module 206 includes an interface such as a serial I/O digital data bus for providing the control signals. Comparator 204 can be coupled to a microcontroller or digital counter 206 for monitoring the comparator output and directing the provision of control signals through interface 206.

Though the amplifier is isolated, the amplifier itself has an inherent DC offset, meaning OUTP may not be equal to OUTN. The amplifier output is sent to comparator 204 and if OUTP>OUTN, the comparator 204 outputs a logic "1" or high. Otherwise, if OUTP<OUTN, the comparator output is a logic "0" or low. If the output is "1," then it is known that INP>INN. Conversely, if the output is "0," then it is known then INP<INN.

It should be noted that in designing the comparator, the comparator itself should not introduce a significant amount of offset. Unlike the amplifier which often needs to operate at high frequencies, the comparator only needs to operate at a very low frequency, e.g., 3-dB bandwidth of several kHz. As a result, large transistors (e.g., the channel length of the input transistor of the comparator can be large) with good matching properties can be used to make the offset of the comparator very small/negligible. Designs for such comparators are well know in the art. In embodiments, the comparator is integrated into the amplifier integrated circuit and the comparator output is monitored by external microcontroller 208 or an on-chip microprocessor.

An exemplary procedure for calibrating the amplifier is described below. An amplifier as described herein is often used in, for example, a high-speed backplane serializer deserializer (SERDES) system, high-speed optical receiver, etc. In these applications, the entire system typically will undergo a one-time calibration. During the calibration process, the amplifier offset is calibrated out and the control signals C1:Cm are determined and set. Though not shown, signals C1:Cm for turning on/off switching devices 119 can be permanently set (e.g., connected, disconnected to an appropriate voltage for triggering device 119) by blowing switches (not shown) as will be familiar to those in the art. Alternatively, if the amplifier IC has an on-chip processor, the control signals can be programmed into a memory accessible to the processor for use during operation of the amplifier.

With reference to FIG. 4, in an embodiment, the calibration procedure is as follows:

(a) open switches connecting INP and INN to isolate the amplifier from outside inputs (step 401);

(b) provide sequential control signal (C1:Cm) combinations to amplifier, (step 402);

(c) monitor the comparator output using on-chip processor or external microcontroller or digital counter and repeat (b), until at, a certain C1:Cm combination, it is observed/detected that the comparator output transitions from "1" to "0" or vice versa (step 403);

(d) permanently program the last C1:Cm combination (or combination immediately preceding a change in comparator output) into the amplifier IC (step 404); and (e) close switches to couple nodes INP and INN to the external inputs and complete calibration of the other elements of the amplifier system as needed (step 405).

The amplifier described herein can be used in any number of applications, and particularly in telecommunication and data communication systems. In one exemplary use, the amplifier is used in connection with optical detection circuitry to amplify the detected voltage from an optical fiber channel. In another exemplary embodiment, the amplifier is used as an amplifier in a DSL (digital subscriber line) system.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An apparatus comprising:
    an amplifier (e.g., 110) having a pair of differential input nodes (e.g., INP, INN) and a pair of differential output nodes (e.g., $V_{ON}$, $V_{OP}$);
    first and second biasing circuits (e.g., $R_{bias}$, $R_{cm}$, $i_{bias}$) coupled to first and second input nodes of the pair of differential input nodes, respectively; and
    a first group of two or more selectable current sources (e.g., 116) coupled to the first input node, wherein the first group selectably adjusts DC voltage at the first input node to compensate for DC offset between the pair of differential output nodes; and
    a second group of one or more selectable current sources (e.g., 116), different from the first group, coupled to the second input node, wherein the second group selectably adjusts DC voltage at the second input node to compensate for the DC offset between the pair of differential output nodes.

2. The invention of claim 1, further comprising control circuitry (e.g., 204, 208, 206) that compares signals at the pair of differential output nodes and generates control signals that control the two or more selectable current sources in the first group and the one or more selectable current sources in the second group.

3. The invention of claim 1, wherein:
    the first group is permanently connected to the first input node; and
    the second group is permanently connected to the second input node.

4. The invention of claim 1, wherein the second group has only one selectable current source.

5. The invention of claim 4, wherein:
    each selectable current source has a corresponding weighting;
    the two or more selectable current sources of the first group are binary weighted with respect to one another; and
    the weighting of the one selectable current source of the second group is greater than a sum of the weightings of the two or more selectable current sources in the first group.

6. The invention of claim 1, further comprising an offset detection circuit (e.g., 204) coupled to the differential output nodes and having an offset detection output (e.g., OUT), wherein the offset detection circuit comprises a comparator.

7. The invention of claim 1, wherein the apparatus is fabricated on an integrated circuit chip.

8. The invention of claim 1, wherein at least one of the selectable current sources comprises a constant current source coupled in series with a switch.

9. The invention of claim 1, wherein each biasing circuit comprises:
    a first resistive element coupled as a bias resistive element between a power supply node and a respective intermediate node;
    a bias current source coupled between the intermediate node and a ground node; and
    a second resistive element coupled between the intermediate node and a respective input node,
    wherein:
        each of the selectable current sources in the first group is coupled between the first input node and the ground node; and
        each of the selectable current sources in the second group is coupled between the second input node and the ground node.

10. The invention of claim 1, wherein the apparatus comprises a decision circuit that slices a signal based on a differential signal presented at the differential output nodes.

11. The invention of claim 1, wherein the apparatus is part of a serializer deserializer (SERDES) system.

12. A method for compensating DC offset at a pair of differential output nodes of an amplifier, the method comprising:
    (a) monitoring outputs at the pair of differential output nodes to characterize DC offset corresponding to a configuration of a plurality of selectable current sources, the plurality of selectable current sources comprising:
        a first group of two or more selectable current sources coupled to a first differential input node of the amplifier; and
        a second group of one or more selectable current sources, different from the first group, coupled to a second differential input node of the amplifier; and
    (b) adjusting, based on the characterization in step (a), the configuration of the plurality of selectable current sources to reduce the DC offset.

13. The invention of claim 12, further comprising (c) repeating steps (a) and (b) for one or more additional iterations, wherein, for each additional iteration, step (a) comprises:
    (a1) comparing an output of a first output node of the pair of differential output nodes to an output of a second output node of the differential output nodes;
    (a2) generating an existing comparison value for the iteration based on the comparison in step (a1); and
    (a3) comparing the existing comparison value to a comparison value for a previous iteration to determine whether or not DC offset is reduced from the previous iteration to the current iteration.

14. The invention of claim 13, wherein:
    in step (c), steps (a) and (b) are repeated for the one or more additional iterations until a configuration of selectable current sources is determined that minimizes DC offset; and
    the method further comprises (d) programming the apparatus to use, during an operating phase of the amplifier, the configuration of selectable current sources that minimizes DC offset.

15. A calibration system for a decision circuit comprising an amplifier having DC offset compensation, the amplifier comprising at least one input node, a pair of differential output nodes, and a DC offset compensation circuit responsive to a control signal to adjust a DC voltage at the input node to provide the DC offset compensation for the amplifier, wherein the offset compensation adjustment circuit comprises a plurality of selectable current sources, selected ones of the current sources being selected for coupling to the input node of the amplifier by the control signal to adjust the DC voltage at the input node to provide the DC offset compensation for the amplifier, the system comprising:

an offset detection module having a pair of inputs corresponding to the output nodes, the offset detection module providing an offset detection output representative of the DC offset; and an offset compensation control module for providing the control signal to the offset compensation adjustment circuit for adjusting the DC offset, wherein the amplifier is formed in an integrated circuit and the offset compensation control module is external to the integrated circuit, wherein the control signal programs the DC offset into the integrated circuit.

16. The invention of claim 15, wherein the plurality of selectable current sources are binary weighted.

* * * * *